United States Patent
van Vroonhoven

(10) Patent No.: US 9,182,453 B2
(45) Date of Patent: Nov. 10, 2015

(54) HALL SENSOR EXCITATION SYSTEM

(71) Applicant: TEXAS INSTRUMENTS DEUTSCHLAND GMBH, Freising (DE)

(72) Inventor: Caspar Petrus Laurentius van Vroonhoven, Munich (DE)

(73) Assignee: TEXAS INSTRUMENTS DEUTSCHLAND GmbH, Freising (DE)

( * ) Notice: Subject to any disclaimer, the term of this patent is extended or adjusted under 35 U.S.C. 154(b) by 213 days.

(21) Appl. No.: 13/754,050

(22) Filed: Jan. 30, 2013

(65) Prior Publication Data

US 2014/0084912 A1  Mar. 27, 2014

(30) Foreign Application Priority Data

Sep. 27, 2012  (GB) .................................... 1217293

(51) Int. Cl.
| | | |
|---|---|---|
| *G01R 33/06* | (2006.01) | |
| *G01R 33/00* | (2006.01) | |
| *G01R 33/07* | (2006.01) | |

(52) U.S. Cl.
CPC .......... *G01R 33/0029* (2013.01); *G01R 33/072* (2013.01); *G01R 33/0023* (2013.01)

(58) Field of Classification Search
CPC .. G01R 33/072; G01R 33/075; G01R 33/077; G01R 33/09; G01R 33/0023; G01R 33/0029
USPC ..................... 324/117, 251; 702/107; 720/183
See application file for complete search history.

(56) References Cited

U.S. PATENT DOCUMENTS

| | | | | |
|---|---|---|---|---|
| 5,406,202 | A | * | 4/1995 | Mehrgardt et al. ........... 324/251 |
| 5,621,319 | A | * | 4/1997 | Bilotti et al. .................. 324/251 |
| 6,466,004 | B1 | * | 10/2002 | Rogers et al. ............. 324/117 H |
| 6,522,131 | B1 | * | 2/2003 | Hiligsmann et al. ....... 324/207.2 |
| 7,428,159 | B2 | * | 9/2008 | Leung et al. .................... 363/95 |
| 2003/0225539 | A1 | * | 12/2003 | Motz et al. ..................... 702/107 |
| 2010/0090684 | A1 | * | 4/2010 | Chen et al. ................ 324/117 H |
| 2013/0069641 | A1 | * | 3/2013 | Motz .............................. 324/251 |

* cited by examiner

*Primary Examiner* — Son Le

(74) *Attorney, Agent, or Firm* — Alan A. R. Cooper; Frank D. Cimino

(57) ABSTRACT

A Hall plate excitation system provides reduced offset and temperature dependence. The Hall plate excitation system includes a current source, a switching network, and a controller. The current source is configured to provide an excitation current to a Hall plate. The switching network is configured to switchably connect the current source to each of a plurality of terminals of the Hall plate. The controller is configured to adjust the excitation current no more than once during each spinning cycle; and to sequentially switch the excitation current to each of the plurality of terminals of the Hall plate during each spinning cycle.

14 Claims, 4 Drawing Sheets

HALL SENSOR EXCITATION SYSTEM

CROSS-REFERENCE TO RELATED APPLICATION

The present application claims priority to U.K. Provisional Patent Application No. 1217293.8, filed on Sep. 27, 2012 which is hereby incorporated herein by reference in its entirety.

BACKGROUND

Hall effect devices are devices that operate in response to a magnetic field based upon the Hall effect. The Hall effect is a phenomenon in which current flow through a conductor in the presence of a magnetic field produces a voltage across the conductor that is orthogonal to both the current and the magnetic field. A Hall effect device may be arranged as a planar structure, known as a Hall plate, that generates an output signal (e.g., either voltage or current) that is proportional to an applied magnetic field. Discrete Hall plates (e.g. based on InSb (indium antimonide)) offer high sensitivity, while integrated (silicon) Hall plates are smaller and less expensive.

The ability of Hall effect devices to sense magnetic fields has resulted in wide adoption of Hall effect sensors. For example, Hall sensors are often employed in non-contact motion sensing applications such as rotation speed measurement, and in current sensing, and compass applications.

SUMMARY

A Hall plate excitation system that provides reduction of offset and temperature dependence is disclosed herein. In one approach, the Hall plate excitation system includes a current source, a switching network, and a controller. The current source is configured to provide an excitation current to a Hall plate. The switching network is configured to switchably connect the current source to each of a plurality of terminals of the Hall plate. The controller is configured to adjust the excitation current no more than once during each spinning cycle; and to sequentially switch the excitation current to each of the plurality of terminals of the Hall plate during each spinning cycle.

In another approach, a Hall effect sensing circuit includes a Hall plate and spinning circuitry. The Hall plate includes a plurality of terminals. The spinning circuitry is coupled to the plurality of terminals, and is configured to sequentially apply a same value of excitation current to each of the plurality of terminals for an integer number of spinning cycles. The spinning circuitry is also configured to change the value of the excitation current only after completion of the integer number of spinning cycles.

In a further approach, a Hall plate excitation circuit includes a current source, a demultiplexer, a sample and hold circuit, and a controller. The demultiplexer includes an input connected to the current source and a plurality of outputs, each of the outputs for connection to one of a plurality of terminals of a Hall plate. The sample and hold circuit is coupled to a control input of the current source. A value of excitation current generated by the current source is based on voltage stored in the sample and hold circuit. The controller is coupled to the demultiplexer and the sample and hold circuit. The controller is configured to maintain a constant voltage in the sample and hold circuit for an integer number of spinning cycles, and to switch the excitation current to each of the plurality of outputs of the demultiplexer during each spinning cycle.

BRIEF DESCRIPTION OF THE DRAWINGS

For a detailed description of various examples, reference will now be made to the accompanying drawings in which.

NOTATION AND NOMENCLATURE

Figure 1:
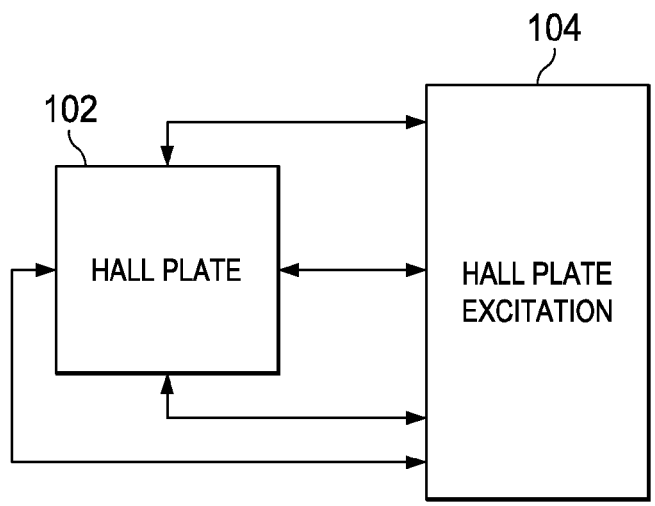
FIG. 1 shows a block diagram of a Hall effect sensing system in accordance with principles disclosed herein.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. The recitation "based on" is intended to mean "based at least in part on." Therefore, if X is based on Y, X may be based on Y and any number of other factors.

DETAILED DESCRIPTION

The following discussion is directed to various aspects of a Hall effect excitation system. Although one or more of these aspects may be preferred, the various approaches discussed herein should not be interpreted, or otherwise used, as limiting the scope of the disclosure, including the claims. In addition, one skilled in the art will understand that the following description has broad application, and the discussion of any implementation is meant only to be exemplary of that implementation, and not intended to intimate that the scope of the disclosure, including the claims, is limited to that implementation.

Hall effect sensors offer excellent linearity and reproducibility, but are subject to offset and low-frequency noise that can limit performance. One method of reducing the effect of such errors, known as spinning, rotates the direction in which a Hall plate is excited and averages the resulting Hall effect sensor outputs.

Spinning decouples the magnetic field signal from offset and low-frequency noise, but only works well when two conditions are met. Firstly, for symmetry reasons, the magnitude of the signal applied to excite the Hall plate should remain constant throughout a spinning cycle. Secondly, if the Hall plate is excited by a current, the output voltage should be sensed, or vice versa (i.e. voltage excitation and current sensing). Since most precision Hall plate interface circuits measure voltage rather than current, current excitation of Hall plates has become the de facto standard for Hall plate interfaces that implement spinning.

When excited by a constant current, a Hall effect sensor's sensitivity to magnetic fields is strongly temperature dependent. For InSb Hall plates, sensor gain can vary by about two orders magnitude over a temperature range of −55° to 125° Celsius. However, when the excitation current is changed over temperature to produce a constant voltage across the Hall sensor, the temperature drift is greatly reduced (e.g., to a few %). Consequently, Hall effect sensors are limited by the need for constant current during spin rotations, and the conflicting need for temperature dependent current to provide well-defined sensitivity over temperature.

The Hall plate excitation system disclosed herein provides a novel solution to the limitations discussed above. The system of the present disclosure controls the excitation current provided to a Hall plate in a feedback loop that enforces a constant voltage across the Hall plate and greatly reduces the temperature dependence of the sensor gain. To provide constant voltage across the Hall plate without affecting the symmetry of the spinning process, the Hall plate excitation system provides a feedback loop that changes the current drive to the Hall plate no more than once per full spin cycle.

FIG. 1 shows a block diagram of a Hall effect sensing system 100 in accordance with principles disclosed herein. The system 100 includes a Hall plate 102 coupled to a Hall plate excitation system 104. The Hall plate 102 may be integrated with the Hall plate excitation system 104 on a single die, or provided as a discrete device that is separate from the Hall plate excitation system 104.

The Hall plate excitation system 104 provides excitation current to the Hall plate 102 via spinning. In spinning, the excitation system 104 provides excitation current to the Hall plate 102 by periodically driving the excitation current through each of the excitation terminals of the Hall plate 102. The spinning technique applied by the excitation system 104 provides constant current to the Hall plate 102 over a full spinning cycle. Thus, across a spinning cycle a same value of excitation current flows through the Hall plate 102 via different paths provided by the plurality of terminals of the Hall plate 102. By providing constant excitation current throughout a spinning cycle, the Hall plate excitation system 104 is able to reduce the offset and low frequency noise that is characteristic of conventional Hall sensing systems.

Figure 2:
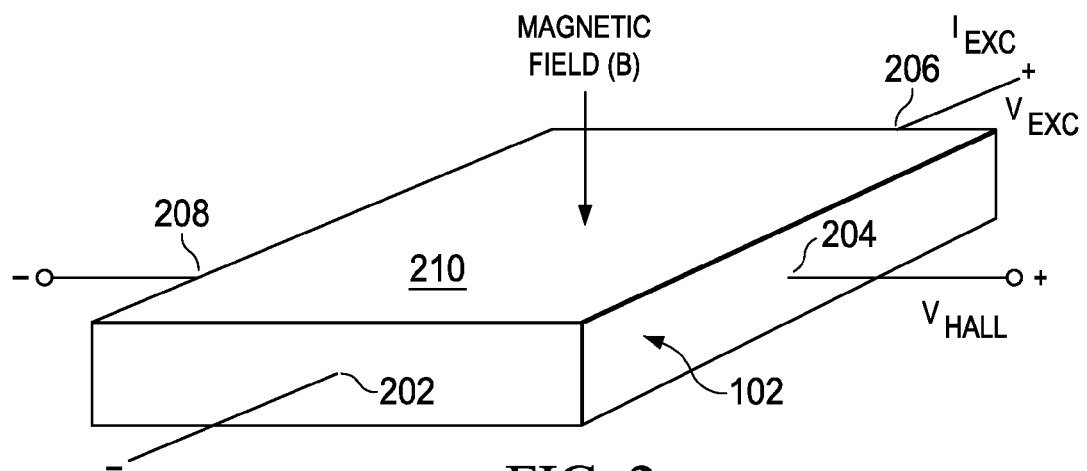
FIG. 2 shows a diagram of a Hall plate of a Hall effect sensing system in accordance with principles disclosed herein.

FIG. 2 shows a diagram of the Hall plate 102. In FIG. 2, the excitation system 104 is sourcing excitation current to the Hall plate 102 via terminal 206 and sinking the excitation current via the terminal 202. Voltage at the terminals 204, 208 of Hall plate 102 is representative of the magnetic field (B) present at the face 210 of the Hall plate 102.

Figure 3:
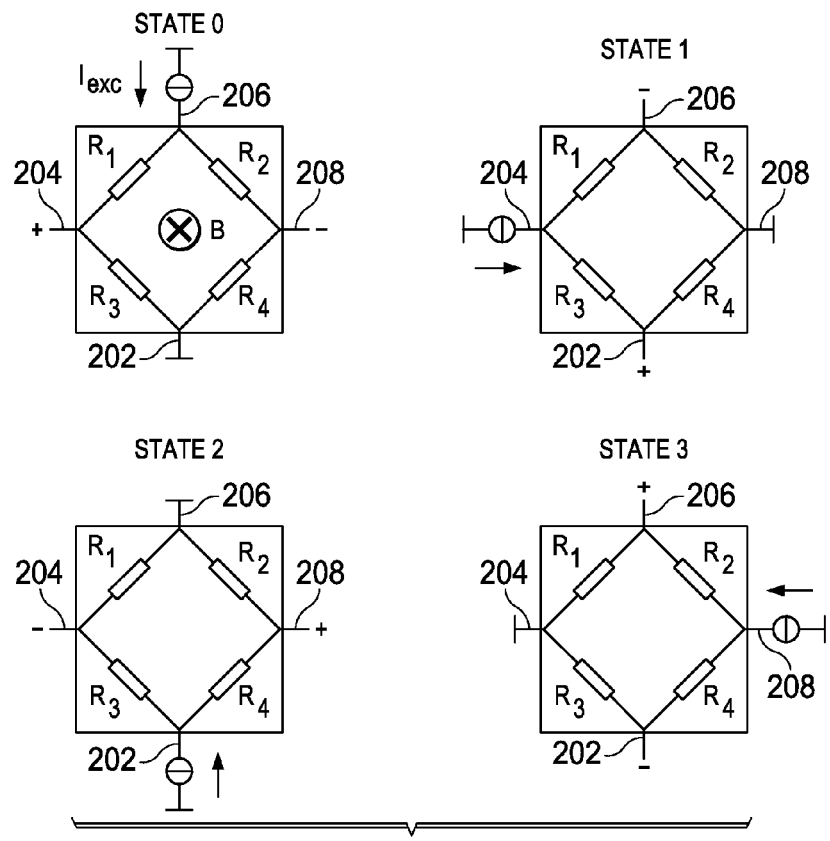
FIG. 3 shows a diagram of Hall plate spinning in accordance with principles disclosed herein.

FIG. 3 shows the application of spinning to the Hall plate 102 by the excitation system 104 over a full spinning cycle, where the Hall plate 102 is modeled as a resistive bridge. In FIG. 3, the spinning cycle includes four states that correspond to the four terminals 202-208 of the Hall plate 102. In state 0 of the spinning cycle, the excitation system 104 sources excitation current to the Hall plate 102 via terminal 206 and sinks the excitation current via the terminal 202, with Hall voltage present across terminals 204 and 208. In state 1 of the spinning cycle, the excitation system 104 sources excitation current to the Hall plate 102 via terminal 204 and sinks the excitation current via the terminal 208, with Hall voltage present across terminals 202 and 206. In state 2 of the spinning cycle, the excitation system 104 sources excitation current to the Hall plate 102 via terminal 202 and sinks the excitation current via the terminal 206, with Hall voltage present across terminals 208 and 204. In state 3 of the spinning cycle, the excitation system 104 sources excitation current to the Hall plate 102 via terminal 208 and sinks the excitation current via the terminal 204, with Hall voltage present across terminals 206 and 202. The excitation current provided to the Hall plate 102 by the excitation system 104 is constant over states 0-3 (i.e., over the full spinning cycle).

Figure 4:
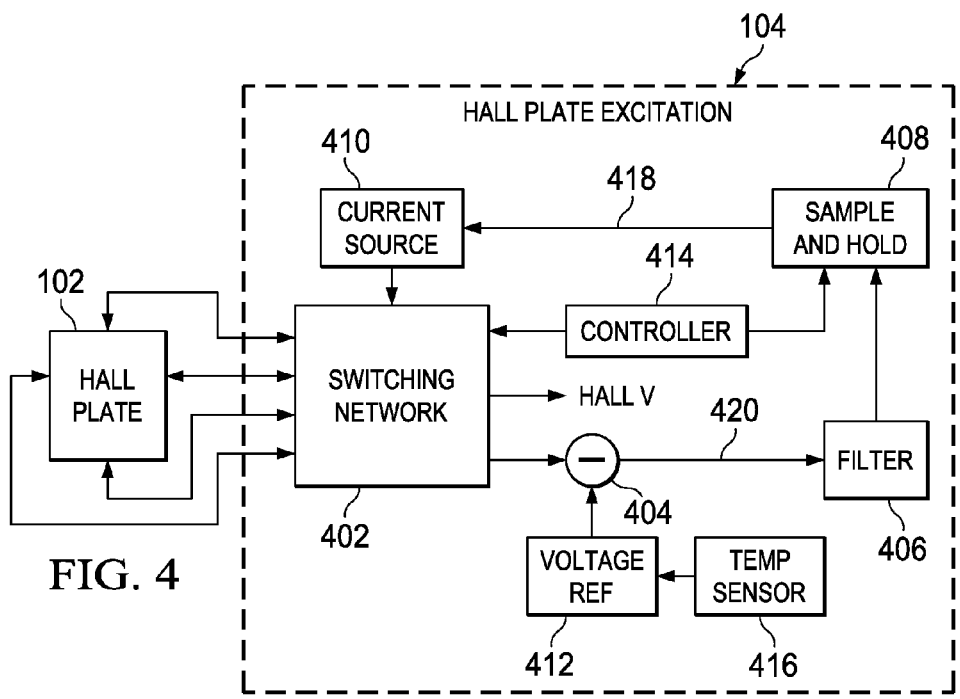
FIG. 4 shows a block diagram of a Hall plate excitation system in accordance with principles disclosed herein.

FIG. 4 shows a block diagram of the Hall plate excitation system 104 in accordance with principles disclosed herein. The excitation system 104 includes a switching network 402, a current source 410, a sample and hold circuit 408, a filter circuit 406, and differencing circuit 404 that form a closed excitation current control loop. A controller 414 generates timing and control signals that control the operations of the various components of the excitation system 104.

The switching network 402 connects the excitation system 104 to the Hall plate 102. More specifically, the switching network 402 includes demultiplexing circuitry that switchably connects the current source 410 and a corresponding reference voltage (e.g., ground) to the terminals of the Hall plate 102. The configuration of the switches in the switching network 402, and the corresponding terminals of the Hall plate 102 connected to the current source 410 and the reference voltage are determined by control signals generated by the controller 414.

The switching network 402 also includes multiplexing circuitry that selects the terminals of the Hall plate 102 from which Hall voltage is provided. The switching network 402 may select the Hall voltage terminals in conjunction with selection of the excitation voltage terminals as shown in FIG. 3.

The switching network 402 may also route excitation voltage, the voltage induced across the Hall plate 102 by the flow of excitation current through the Hall plate 102, to the differencing circuitry 404. The excitation voltage provided to the difference circuitry 404 may be voltage induced across the Hall plate 102 during one or more phases of the spinning cycle. For example, the switching network 402 may provide, to the differencing circuitry 404, excitation voltage corresponding to a single phase of the spinning cycle (e.g., state 0 shown in FIG. 3), or alternatively may provide, to the differencing circuitry 404, excitation voltage corresponding to multiple phases of the spinning cycle (e.g., states 0-3 shown in FIG. 3). When providing excitation voltage corresponding to multiple phases of the spinning cycle, the excitation voltages corresponding to the different phases may be provided to the differencing circuitry 404 during a single spinning cycle or during different spinning cycles.

The differencing circuitry 404 determines a difference between the induced excitation voltage and a target excitation voltage. The target excitation voltage is a reference voltage generated by the voltage reference circuit 412. The difference between the target excitation voltage and induced excitation voltage is filtered by the filter circuit 406. The filter circuit 406 may be an integrator or other low-pass filter circuit. In some implementations, the filter 406 may be an all-pass gain stage. The filter circuit 406 may generate a filtered difference voltage that is an average over time of the values of excitation voltage induced across the Hall plate 102. The filtered difference voltage generated by the filter circuit 406 is provided to the sample and hold circuit 408.

The sample and hold circuit 408 provides a control voltage to the current source 410 that determines the value of excitation current generated by the current source 410. The output impedance of the current source 410 may be high enough that changes in the voltage across the current source 410 have little effect on the excitation current generated by the current source 410. The control voltage provided by the sample and hold circuit 408 changes no more frequently than once per full spinning cycle. Consequently, the excitation current generated by the current source 410 changes no more frequently than once per spinning cycle. The time at which the sample and hold circuit 408 samples the filtered difference voltage, and changes the current source control voltage, may be determined by a control signal generated by the controller 414. For example, the controller 414 may generate a control signal that causes the sample and hold circuit 408 to sample the filtered difference voltage once per integer number of spinning cycles.

Thus, the excitation system 104 adjusts the excitation current provided to the Hall plate 104 only after providing a constant excitation current for an integer number of spinning cycles, and drives the induced excitation voltage to equal the target excitation voltage over time by controlling the current source 410 via the filtered difference voltage. By driving the induced excitation voltage to equal the target excitation voltage, the excitation system 104 greatly reduces (e.g., by a factor of 100) the temperature dependence of the Hall plate magnetic field measurements relative to a conventional Hall sensing system. Because the frequency of spinning provided by the excitation system 104 may be several orders of magnitude higher than the bandwidth associated with temperature fluctuations (100's of kHz vs. 10's of Hz), there is little or no risk of sampling temperature fluctuations too infrequently.

The excitation system 104 may also include a temperature sensor 416 that measures the temperature proximate the Hall plate 102. Temperature measurements provided by the temperature sensor 416 may be applied to adjust the reference voltage generated by the voltage reference circuit. 412. Accordingly, the value of the target excitation voltage value may be based, at least in part, on the temperature proximate the Hall plate 102 to maintain constant and/or further control the magnetic sensitivity of the Hall sensing system 100. For example, the target excitation voltage may increase with temperature.

The voltage reference circuit 412 may also include a digital-to-analog converter that provides or controls the value of voltage provided as the target excitation voltage.

The filter 406 and the sample and hold 408 form a control voltage generator that generates the control voltage 418 provided to the current source 410. The Hall plate excitation system 104 may employ different control voltage generation circuitry in place of the filter and sample and hold to move the induced excitation voltage to equal the target excitation voltage while changing the control voltage 418 no more than once per spinning cycle. For example, the difference voltage 420 may be applied to update a pulse width modulator no more than once per spinning cycle, where the output of the pulse width modulator is filtered to produce the control voltage 418.

Figure 5:
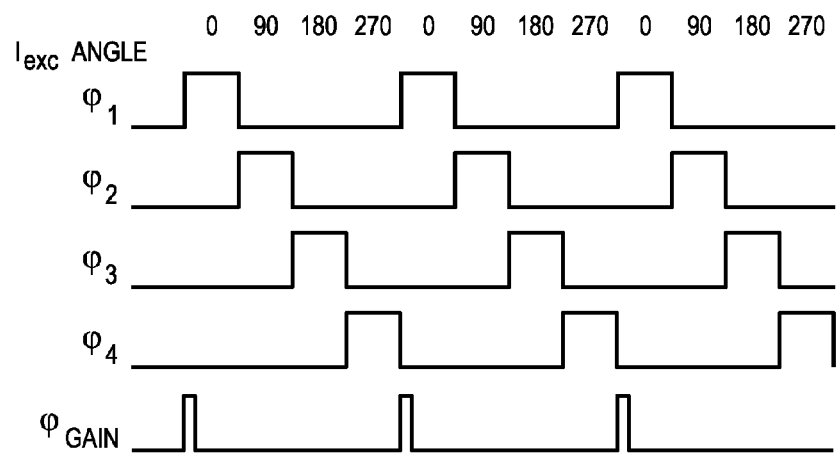
FIGS. 5, 6A, and 6B show diagrams of Hall plate excitation control signals in accordance with principles disclosed herein.

FIG. 5 shows a diagram of Hall plate excitation control signals generated by the controller 414 in accordance with principles disclosed herein. The phase 1 through 4 signals $\phi_1$-$\phi_4$ may be provided to the switching network 402 to control the routing of the excitation current to the Hall plate 102, routing of Hall voltage from the Hall plate 102, routing of excitation voltage, etc. For example, each signal $\phi_1$-$\phi_4$ may cause the switching network 402 to connect to the Hall plate 102 in a different one of the state configurations shown in FIG. 3. The signal $\phi_{gain}$ may control updating of the sample and hold circuit 408 and control voltage 418. In practice, to remove 1/f noise by spinning, the spinning frequency generated by the controller 414 may be at least as high as the 1/f noise corner frequency of the hall sensor (typically at several kHz).

Figure 6A:
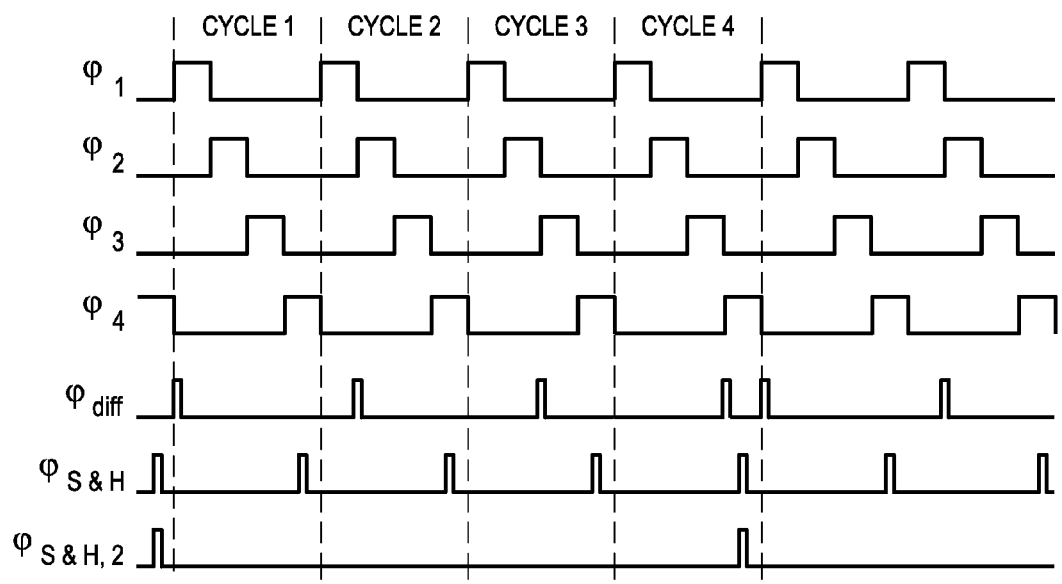

FIG. 6A shows another diagram of Hall plate excitation control signals generated by the controller 414 in accordance with principles disclosed herein. FIG. 6A shows multiple spinning cycles. As explained above, the control voltage 418 may be derived from excitation voltage induced across the Hall plate 102 during one or more phases of a spinning cycle. FIG. 6A illustrates various approaches to generation of the control voltage 418 from excitation voltage produced during different phases of a spinning cycle. In FIG. 6A, excitation voltage produced during a different phase of a spinning cycle is provided to the differencing circuitry 404 during each spinning cycle. The signal $\phi_{diff}$ controls the timing of excitation voltage capture or provision to the differencing circuitry 404. Thus, in cycle 1, excitation voltage produced during phase 1 is provided to the differencing circuitry. In cycle 2, excitation voltage produced during phase 2 is provided to the differencing circuitry, and so on. Thus, for the four terminal Hall plate 102, excitation voltages for all phases are processed each four spinning cycles. The filter circuitry 406 averages the difference values derived from the excitation voltages.

The sample and hold circuit 408 may capture the filtered difference voltage at a predetermined time during each spinning cycle as illustrated by the signal $\phi_{S\&H}$, or at a predetermined time every N spinning cycles as illustrated by the signal $\phi_{S\&H,2}$. In FIG. 6A, the excitation voltage for four successive spinning phases is captured in four successive spinning cycles, while control voltage 418 is updated during each phase 4 of each spinning cycle in accordance with $\phi_{S\&H}$, or updated every fourth spinning cycle in accordance with $\phi_{S\&H,2}$.

Figure 6B:
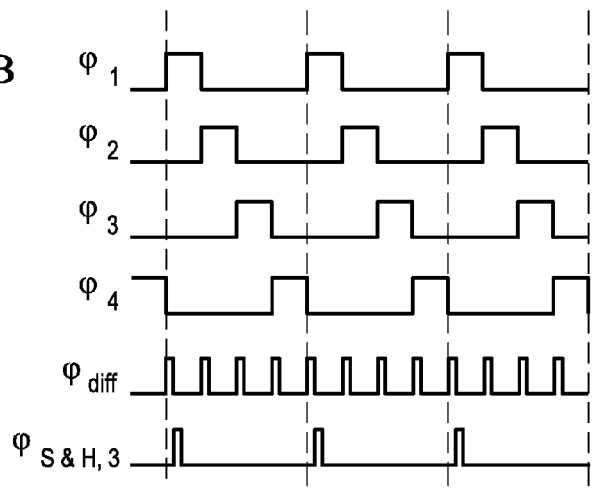

The controller 414 may also generate signals that cause the Hall plate excitation system 104 to capture the excitation voltage across the Hall plate 102 during all phases of each spinning cycle. FIG. 6B shows excitation voltage produced during each phase of a spinning cycle being provided to the differencing circuitry 404 in accordance with signal $\phi_{diff}$. The filter circuitry 204 averages the difference values derived from the excitation voltages, and the sample and hold circuit 402 is updated, based on the filtered difference voltage, no more than once per spinning cycle in accordance with signal $\phi_{S\&H,3}$.

Figure 7:
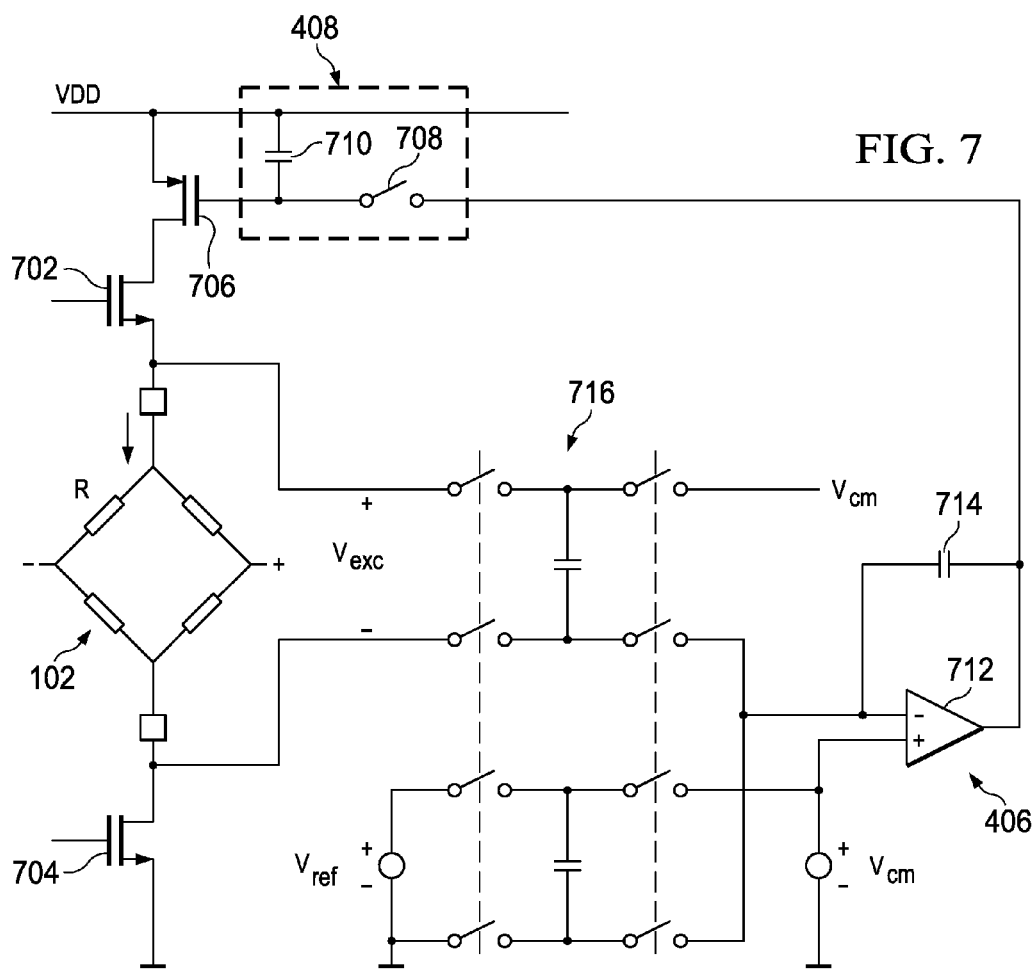
FIG. 7 shows a schematic diagram of a Hall Plate excitation circuit in accordance with principles disclosed herein.

FIG. 7 shows a schematic diagram of a Hall Plate excitation circuit in accordance with principles disclosed herein. FIG. 7 shows circuit elements of the excitation system 104 applied in one state of the spinning cycle. The Hall plate 102 is modeled as a resistive bridge. Transistors 702, 704 are switches of the switching network 402 routing excitation current to selected terminals of the Hall plate 102.

Transistor 706 corresponds to the current source 410 and is controlled by the sample and hold circuit 408. The sample and hold circuit 408 includes hold capacitor 710 and sampling switch 708. The filter 406 comprises an integrator formed from amplifier 712 and capacitor 714.

The excitation voltage induced across the Hall plate 102 by the flow of excitation current is sampled in the switched capacitor network 716 along with the target excitation voltage. The difference between the induced excitation voltage and the target excitation voltage is determined at the input of the amplifier 712. In the implementation of FIG. 7, the timing of charge transfer to and from the switched capacitor network 716, and of sampling of the filtered difference voltage is controlled by the controller 414. The sampling of the induced excitation voltage, comparison of the induced excitation voltage to the target excitation voltage, and update of the current source control voltage may respectively occur during first, second, and third portions of the spinning cycle as controlled by controller 414.

The closed-loop Hall plate excitation system 104 provides constant current through each full spinning cycle while also providing constant average voltage across the Hall plate, thereby reducing temperature dependence, and enabling accurate offset and low-frequency noise cancellation. Use of the sample and hold circuit 408, and other elements of the excitation system 104, to establish a constant current per spin cycle results in a small and easily integrated high performance excitation system. While similar performance may be achievable using a very low bandwidth feedback loop, such a loop would require large passive components that are difficult to provide on an integrated circuit.

Conventional open-loop Hall plate sensing systems may attempt to compensate for Hall voltage temperature dependence by applying temperature dependent gain to either the Hall voltage or the excitation current. Provision of temperature dependent gains in conventional systems requires accurate determination of the gains/sensitivities of each block of the signal chain. The closed-loop excitation system 104 advantageously requires no such gain determination and is not subject to the errors caused by inaccuracies in gain determination for electronic components of the signal chain.

Some conventional Hall sensors include a coil to generate a reference magnetic field used to calibrate sensor output. Unfortunately, such sensors, while accurate, consume a large amount of space, significant power, and are susceptible to magnetic interference. The closed-loop excitation system 104 effectively avoids such limitations via the components and architecture disclosed herein.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

What is claimed is:

1. A Hall plate excitation system, comprising:
   a current source configured to provide an excitation current to a Hall plate;
   a switching network configured to switchably connect the current source to each of a plurality of terminals of the Hall plate; and
   a controller configured to:
     adjust the excitation current no more than once during each of a plurality of spinning cycles; and
     sequentially switch the excitation current to each of the plurality of terminals of the Hall plate during each spinning cycle;
   a control voltage generator coupled to the current source; wherein the control voltage generator is configured to control the excitation current generated by the current source;
   a filter circuit coupled to the control voltage generator; wherein the filter circuit is configured to set the voltage of the control voltage generator based on a difference of a target excitation voltage and an excitation voltage induced across the Hall plate by the excitation current;
   a temperature sensor configured to measure temperature proximate the Hall plate; and
   a reference voltage generator configured to generate the target excitation voltage based, at least in part, on a temperature measurement provided by the temperature sensor.

2. The system of claim 1, wherein the control voltage generator comprises a sample and hold circuit.

3. The system of claim 1, wherein the controller is configured to change the voltage output of the control voltage generator provided to the current source by the control voltage generator no more than once per spinning cycle.

4. The system of claim 1, wherein the filter circuit comprises an integrator configured to adjust the excitation voltage induced across the Hall plate by the excitation current towards the target excitation voltage.

5. A Hall effect sensing circuit, comprising:
   a Hall plate comprising a plurality of terminals;
   spinning circuitry coupled to the plurality of terminals, the spinning circuitry configured to:
     sequentially apply a same value of excitation current to each of the plurality of terminals for an integer number of spinning cycles; and
     change the value of the excitation current only after completion of the integer number of spinning cycles,
   a control voltage generator coupled to the current source; wherein the control voltage generator is configured to control the excitation current generated by the current source;
   a filter circuit coupled to the control voltage generator; wherein the filter circuit is configured to set the voltage of the control voltage generator based on a difference of a target excitation voltage and an excitation voltage induced across the Hall plate by the excitation current;
   a temperature sensor configured to measure temperature proximate the Hall plate; and
   a reference voltage generator configured to generate the target excitation voltage based, at least in part, on a temperature measurement provided by the temperature sensor.

6. The sensing circuit of claim 5, wherein the Hall plate comprises at least four terminals.

7. The sensing circuit of claim 5, wherein the spinning circuitry comprises:
   a current source configured to generate the excitation current;
   a plurality of switches configured to selectably route the excitation current from the current source to each of the plurality of terminals; and
   control circuitry configured to sequentially route the excitation current, via the switches, to each of the plurality of terminals during each spinning cycle.

8. The sensing circuit of claim 5, wherein the spinning circuitry comprises sample and hold circuitry coupled to the current source; wherein the value of the excitation current is based on a voltage output of the sample and hold circuit.

9. The sensing circuit of claim 8, wherein voltage stored in the sample and hold circuit is changed at an integer spinning cycle interval.

10. The sensing circuit of claim 5, wherein the filter is configured to control the value of the excitation current such that an excitation voltage induced across the Hall plate by the excitation current approaches a target excitation voltage.

11. A Hall plate excitation circuit, comprising:
    a current source;
    a demultiplexer comprising an input connected to the current source and a plurality of outputs, each of the outputs for connection to one of a plurality of terminals of a Hall plate;
    a sample and hold circuit coupled to a control input of the current source; wherein a value of excitation current generated by the current source is based on voltage stored in the sample and hold circuit; and
    a controller coupled to the demultiplexer and the sample and hold circuit, the controller configured to:
      maintain a constant voltage in the sample and hold circuit for an integer number of spinning cycles; and switch the excitation current to each of the plurality of outputs of the demultiplexer during each spinning cycle, a control voltage generator coupled to the current source; wherein the control voltage generator is configured to control the excitation current generated by the current source;

a filter circuit coupled to the control voltage generator; wherein the filter circuit is configured to set the voltage of the control voltage generator based on a difference of a target excitation voltage and an excitation voltage induced across the Hall plate by the excitation current;

a temperature sensor configured to measure temperature proximate the Hall plate; and a reference voltage generator configured to generate the target excitation voltage based, at least in part, on a temperature measurement provided by the temperature sensor.

12. The excitation circuit of claim 11,
wherein the filter comprises
an input coupled to an output of the demultiplexer; and
an output coupled to the sample and hold circuit;
wherein the filter is configured to set the voltage stored in the sample and hold circuit based on a difference of a target excitation voltage and an excitation voltage induced across the Hall plate by flow of the excitation current.

13. The excitation circuit of claim 12, wherein the filter circuit comprises an integrator configured to adjust the excitation voltage towards the target excitation voltage.

14. The excitation circuit of claim 11, wherein the controller is configured to connect each of the plurality of terminals of a Hall plate to a reference voltage during each spinning cycle to form a plurality of paths for flow of the excitation current flow through the Hall plate during the spinning cycle.

* * * * *